(12) United States Patent
Tangudu et al.

(10) Patent No.: US 11,777,374 B2
(45) Date of Patent: Oct. 3, 2023

(54) INTEGRATED MOTOR DRIVE ARCHITECTURE

(71) Applicant: Hamilton Sundstrand Corporation, Charlotte, NC (US)

(72) Inventors: Jagadeesh Kumar Tangudu, South Windsor, CT (US); Aritra Sur, South Windsor, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 213 days.

(21) Appl. No.: 17/223,297

(22) Filed: Apr. 6, 2021

(65) Prior Publication Data
US 2022/0320965 A1 Oct. 6, 2022

(51) Int. Cl.
| | | |
|---|---|---|
| H02K 9/20 | (2006.01) | |
| H02K 11/33 | (2016.01) | |
| H02K 7/00 | (2006.01) | |
| H02K 7/116 | (2006.01) | |
| H02K 21/24 | (2006.01) | |
| B64D 27/24 | (2006.01) | |

(52) U.S. Cl.
CPC ............. *H02K 9/20* (2013.01); *H02K 7/003* (2013.01); *H02K 7/116* (2013.01); *H02K 11/33* (2016.01); *H02K 21/24* (2013.01); *B64D 27/24* (2013.01); *H02K 2211/03* (2013.01)

(58) Field of Classification Search
CPC . H02K 9/20; H02K 9/10; H02K 11/33; H02K 7/116; H02K 21/24
USPC .................. 310/52, 54, 58–59, 60 R, 64, 66
See application file for complete search history.

(56) References Cited

U.S. PATENT DOCUMENTS

| | | | |
|---|---|---|---|
| 4,975,803 A | 12/1990 | Niggemann | |
| 6,914,357 B2 | 7/2005 | Tabatowski-Bush et al. | |
| 10,314,207 B1* | 6/2019 | Skalski | ............... H05K 5/0291 |
| 2006/0096299 A1 | 5/2006 | Mamitsu et al. | |
| 2012/0299407 A1* | 11/2012 | Miyama | ................ H02K 11/33 |
| | | | 310/63 |

FOREIGN PATENT DOCUMENTS

| | | | |
|---|---|---|---|
| CN | 201904763 U | 7/2011 | |
| CN | 209731002 U | * 12/2019 | ............. H02K 11/30 |

OTHER PUBLICATIONS

Search Report issued for European Application No. 22165572.3; Application Filing Date Mar. 30, 2022; dated Aug. 11, 2022 (6 pages).

* cited by examiner

*Primary Examiner* — Jose A Gonzalez Quinones
(74) *Attorney, Agent, or Firm* — CANTOR COLBURN LLP

(57) ABSTRACT

A motor drive architecture is provided. The motor drive architecture includes a three-dimensional (3D) stack of cold plates on which power electronic components for an electric machine are mountable and supporting structures. Each cold plate has an annular shape with internal fluid pathways. The supporting structures hold the cold plates in the 3D stack. At least one supporting structure defines an internal cavity bifurcated into an internal inlet fluid pathway configured to direct fluid into the internal fluid pathways of each cold plate and an internal outlet fluid pathway receptive of the fluid from the internal fluid pathways of each cold plate.

20 Claims, 4 Drawing Sheets

INTEGRATED MOTOR DRIVE ARCHITECTURE

BACKGROUND

The present disclosure relates to a motor drive and, in particular, to an integrated motor drive architecture with a three-dimensional stack-up.

For high power density electric drive train systems, it is often critical to be able to reduce the overall weight of the system. This can be achieved by using very compactly designed component packages and by achieving integration among components. Thermal management is also key in order to achieve higher power densities since it ensures safe operation of the power electronic components. Usually, however, thermal management related components can contribute significant weight to overall system.

BRIEF DESCRIPTION

According to an aspect of the disclosure, a motor drive architecture is provided. The motor drive architecture includes a three-dimensional (3D) stack of cold plates on which power electronic components for an electric machine are mountable and supporting structures. Each cold plate has an annular shape with internal fluid pathways. The supporting structures hold the cold plates in the 3D stack. At least one supporting structure defines an internal cavity bifurcated into an internal inlet fluid pathway configured to direct fluid into the internal fluid pathways of each cold plate and an internal outlet fluid pathway receptive of the fluid from the internal fluid pathways of each cold plate.

In accordance with additional or alternative embodiments, the power electronic components are configured to execute switching operations and include passive and active components on at least one of the cold plates.

In accordance with additional or alternative embodiments, each of the cold plates of the 3D stack is fittable about a shaft of the electric machine and is coaxial with the other cold plates and the power electronic components include power devices and gate drivers arranged coaxially on each of the cold plates.

In accordance with additional or alternative embodiments, each cold plate has a configuration in accordance with a configuration of the electric machine.

In accordance with additional or alternative embodiments, the cold plates are stacked in the 3D stack with equidistant spacing or non-equidistant spacing.

In accordance with additional or alternative embodiments, the internal inlet fluid pathway of the at least one supporting structure is receptive of the fluid from an external source and the internal outlet fluid pathway of the at least one supporting structure is configured to direct the fluid toward the external source.

In accordance with additional or alternative embodiments, each of the support structures defines an internal cavity bifurcated into an internal inlet fluid pathway configured to direct the fluid into the internal fluid pathways of each cold plate and an internal outlet fluid pathway receptive of fluid from the internal fluid pathways of each cold plate.

According to another aspect of the disclosure, an integrated motor drive architecture is provided. The integrated motor drive architecture includes an electric machine, a three-dimensional (3D) stack of cold plates and supporting structures. The electric machine includes a stator, a rotor, a shaft which is driven to rotate by an electromagnetic field induced by current applied to windings of the stator. Power electronic components for controlling applications of the current to the windings are mounted on the 3D stack. Each cold plate has an annular shape, which is fittable about the shaft, with internal fluid pathways. The supporting structures support each of the cold plates in the 3D stack. At least one supporting structure defines an internal cavity bifurcated into an internal inlet fluid pathway configured to direct fluid into the internal fluid pathways of each cold plate and an internal outlet fluid pathway receptive of the fluid from the internal fluid pathways of each cold plate.

In accordance with additional or alternative embodiments, the power electronic components are configured to execute switching operations and include passive and active components on at least one of the cold plates.

In accordance with additional or alternative embodiments, each of the cold plates of the 3D stack is fittable about a shaft of the electric machine and is coaxial with the other cold plates and the power electronic components comprise power devices and gate drivers arranged coaxially on each of the cold plates.

In accordance with additional or alternative embodiments, each cold plate has a configuration in accordance with a configuration of the electric machine.

In accordance with additional or alternative embodiments, the cold plates are stacked in the 3D stack with equidistant spacing or non-equidistant spacing.

In accordance with additional or alternative embodiments, the internal inlet fluid pathway of the at least one supporting structure is receptive of the fluid from an external source and the internal outlet fluid pathway of the at least one supporting structure is configured to direct the fluid toward the external source.

In accordance with additional or alternative embodiments, each of the supporting structures defines an internal cavity bifurcated into an internal inlet fluid pathway configured to direct the fluid into the internal fluid pathways of each cold plate and an internal outlet fluid pathway receptive of fluid from the internal fluid pathways of each cold plate.

According to an aspect of the disclosure, an integrated motor drive architecture is provided. The integrated motor drive architecture includes an electric machine, a three-dimensional (3D) stack of cold plates and supporting structures. The electric machine includes a stator, a rotor, a shaft which is driven to rotate by an electromagnetic field induced by current applied to windings of the stator. The 3D stack of cold plates is integrated with the electric machine and power electronic components for controlling applications of the current to the windings are mountable thereon. Each cold plate has an annular shape, which is fittable about the shaft, with internal fluid pathways. The supporting structures support each of the cold plates in the 3D stack. At least one supporting structure defines an internal cavity bifurcated into an internal inlet fluid pathway configured to direct fluid into the internal fluid pathways of each cold plate and an internal outlet fluid pathway receptive of the fluid from the internal fluid pathways of each cold plate.

In accordance with additional or alternative embodiments, the power electronic components are configured to execute switching operations and include passive and active components on at least one of the cold plates.

In accordance with additional or alternative embodiments, each of the cold plates of the 3D stack is fittable about a shaft of the electric machine and is coaxial with the other cold plates and the power electronic components include power devices and gate drivers arranged coaxially on each of the cold plates.

In accordance with additional or alternative embodiments, each cold plate has a configuration in accordance with a configuration of the electric machine.

In accordance with additional or alternative embodiments, the cold plates are stacked in the 3D stack with equidistant spacing or non-equidistant spacing.

In accordance with additional or alternative embodiments, the internal inlet fluid pathway of the at least one supporting structure is receptive of the fluid from an external source and the internal outlet fluid pathway of the at least one supporting structure is configured to direct the fluid toward the external source.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, a motor drive is provided and includes a three-dimensional (3D) stack-up design that includes multiple donut-shaped cold plates on, which power electronic switching modules are mounted, and which execute a switching functionality of the motor drive. The cold plates are supported by three axial supports which as act as coolant flow manifolds. This configuration requires only a single inlet port and a single outlet port for the coolant in the motor drive. With the coolant flow manifolds being combined with flow routing, uniform coolant distribution can be ensured. The donut-shape of the cold plates facilitates the mounting scheme directly on a motor of the motor drive and provides a path for a motor shaft of the motor drive to be connected to other components in the system.

Figure 1A:
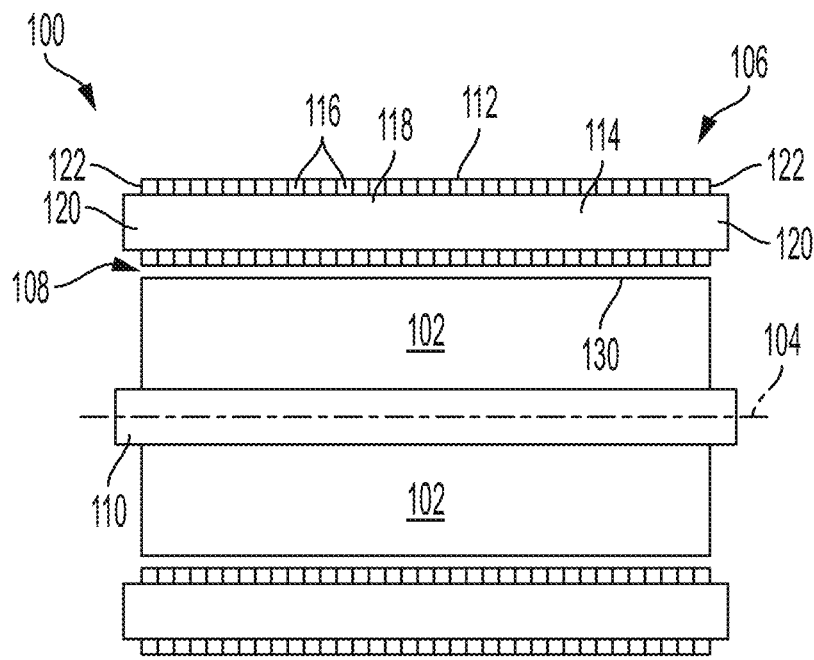
FIG. 1A is a partial view of an embodiment of electric machine.
Figure 1B:
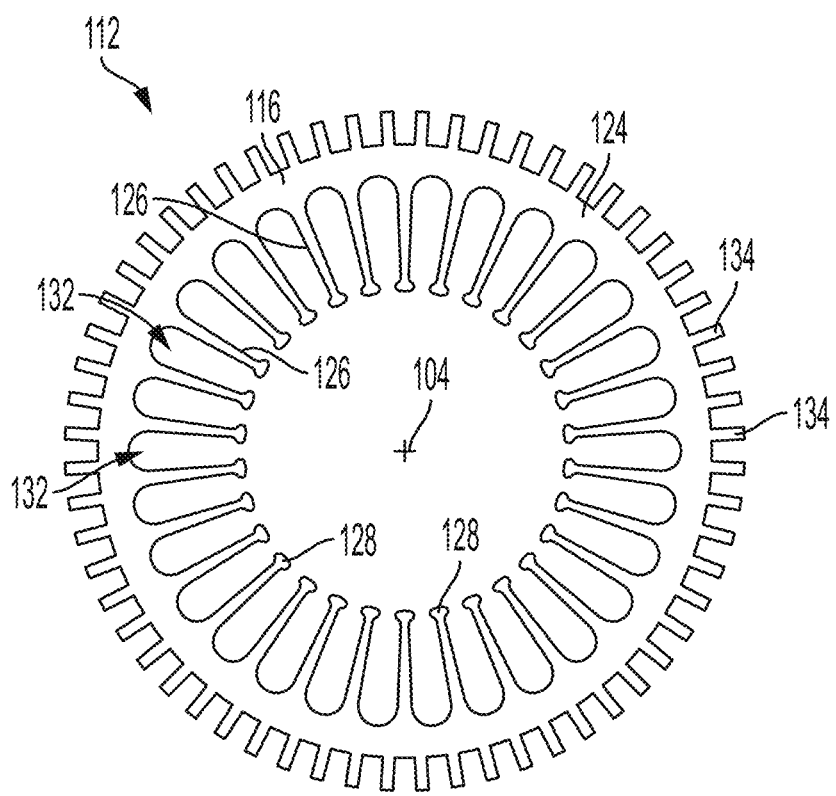
FIG. 1B is a cross-sectional view of an embodiment of a stator core of the electric machine of FIG. 1A.

With reference to FIGS. 1A and 1B, an electric machine 100 is provided and includes a rotor 102 configured to rotate about a rotation axis 104. A stator 106 is located radially outboard of the rotor 102 relative to the rotation axis 104, with a radial air gap 108 located between the rotor 102 and the stator 106. As illustrated, the rotor 102 may be mounted on a shaft 110 which may impart rotational movement to the rotor 102 or may be driven by rotation of the rotor 102, as will be appreciated by those of skill in the art. The rotor 102 and the shaft 110 may be fixed together such that the rotor 102 and the shaft 110 rotate about the rotation axis 104 together as one piece.

The stator 106 includes a stator core 112 in which a plurality of electrically conductive stator windings 114 are disposed. In some embodiments, such as the embodiment shown in FIG. 1A, the stator core 112 is formed from a plurality of axially stacked laminations 116, which are stacked along the rotation axis 104. In some embodiments, the laminations 116 are formed from a steel material, but one skilled in the art will readily appreciate that other materials may be utilized. The stator windings 114, as shown, include core segments 118 extending through the stator core 112 and end turn segments 120 extending from each axial stator end 122 of the stator core 112 and connecting circumferentially adjacent core segments 118. When the stator windings 114 are energized via an electrical current therethrough, the resulting field drives rotation of the rotor 102 about the rotation axis 104.

Although FIG. 1A illustrates the stator core 112 arranged radially inward from the stator windings 114, it will be appreciated that other configurations are possible without departing from the scope of the present disclosure. For example, in some embodiments, the stator structure may be arranged radially inward from a rotating rotor structure.

FIG. 1B is an axial cross-sectional view of the stator core 112. Each lamination 116 of the stator core 112 includes a radially outer rim 124 with a plurality of stator teeth 126 extending radially inwardly from the outer rim 124 toward the rotation axis 104. Each of the stator teeth 126 terminate at a tooth tip 128, which, together with a rotor outer surface 130 (shown in FIG. 1A) of the rotor 102, may define the radial air gap 108. Circumferentially adjacent stator teeth 126 define an axially-extending tooth gap 132 therebetween. Further, in some embodiments, a plurality of stator fins 134 extend radially outwardly from the outer rim 124.

Electric machines, as shown in FIGS. 1A and 1B may require cooling due to high density configurations, various operational parameters, or for other reasons. For example, high-power-density aviation-class electric machines and drives may require advanced cooling technologies to ensure proper operation of the motors/drives. These machines are generally thermally limited at high power ratings and their performance can be improved by mitigating thermal limitations. To maintain desired temperatures, a thermal management system (TMS) is integrated into the system, which provides cooling to components of the system. Onboard an aircraft, power requirements, and thus thermal management system (TMS) loads, are substantially higher during takeoff. Sizing of the TMS for takeoff conditions (i.e., maximum loads) often results in a TMS having a high weight to accommodate such loads. This can result in greater weight and lower power density during cruise conditions which do not generate such loads, and thus does not require a high cooling capacity TMS. Balancing weight constraints and thermal load capacities is important for such aviation applications.

In view of such considerations, improved aviation electric machines are provided herein. The aviation electric machines or aircraft electric machines, described herein, incorporate lightweight materials and compact design to reduce weight, improve thermal efficiencies, improve power efficiencies, and improve power density.

Figure 2:
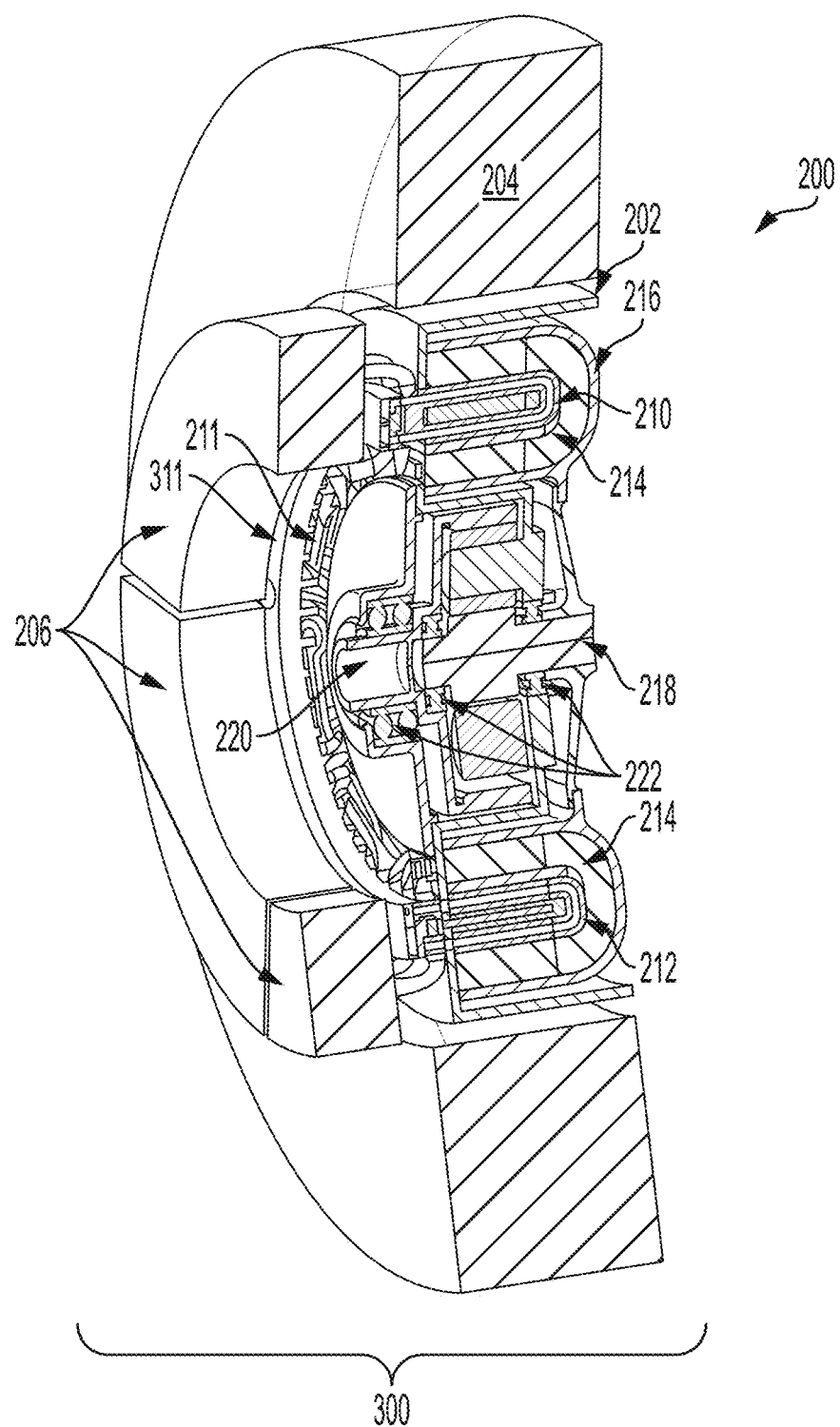
FIG. 2 is a cutaway perspective view of an aircraft electric machine in accordance with embodiments.

Turning now to FIG. 2, an aircraft electric machine 200 is provided and includes a motor housing 202, a condenser 204 and a power module system 206, which is separated from the motor housing 202 by plenum 208. The motor housing 202 houses a stator 210 and a rotor 212, with the rotor 212 configured to be rotatable about the stator 210. The rotor 212 includes a U-shaped magnet 214 that is arranged within a similarly shaped U-shaped rotor sleeve 216. The rotor sleeve 216 is operably connected to a hub 218, which is fixedly attached to a shaft 220. The shaft 220 is supported by bearings 222. The condenser 204 is configured to provide cooling to the components of the aircraft electric machine 200 and can include a heat exchanger and a header forming a closed-loop cooling system that provides air-cooling to a working fluid at the heat exchanger. As the aircraft electric machine 200 is operated, heat is generated and picked up by the working fluid within embedded cooling channels. The resulting heated working fluid is then passed through the header and back to the heat exchanger to be cooled, such as by air cooling. As shown, the condenser 204 may be a circular structure arranged about the motor housing 202. This configuration and arrangement allows for improved compactness of the system, which may be advantageous for aircraft applications. The rotor sleeve 216 with the magnets 214, the stator 210 and the gear assembly fit together (although moveable relative to each other) within the motor housing 202, providing for a compact (low volume/size) design.

The power module system 206 includes capacitors and other electronics, including, but not limited to, printed circuit boards (PCBs) that may enable control and operation of the aircraft electric machine 200. In general, the power module system 206 is electrically connected to the stator 210 to cause an electric current therein which will induce an electromagnetic field which will cause the rotor 212 to rotate. More particularly, the stator 210 includes windings 211 to which the power module 206 is attached and the power module 206 thus causes the electric current to be applied to the windings 211. The current in the windings 211 induces the electromagnetic field to drive the rotor 212 rotations.

Figure 3:
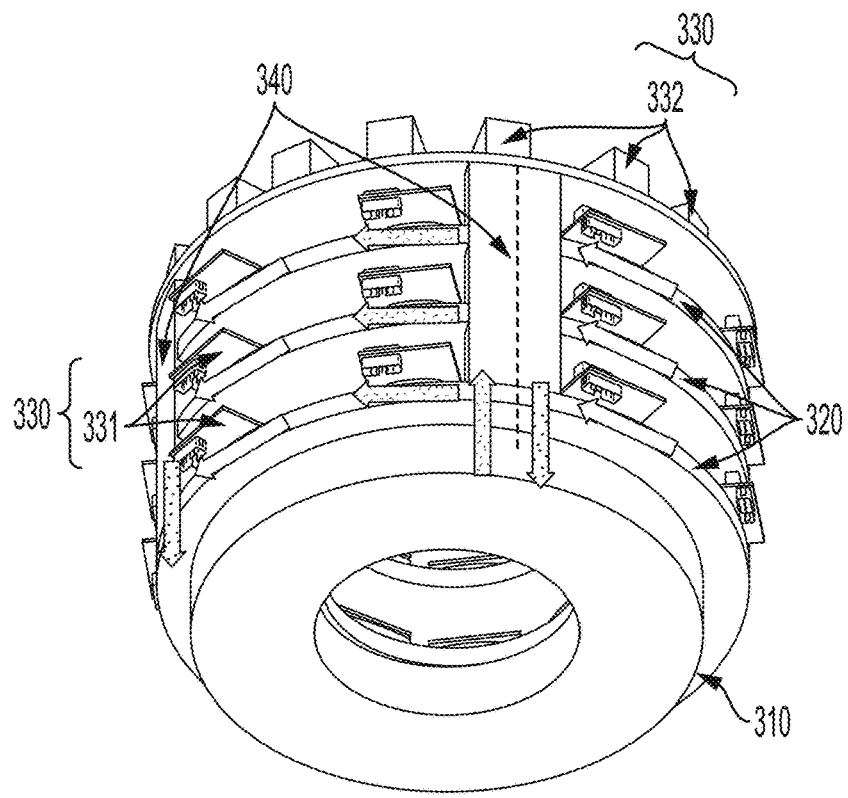
FIG. 3 is a perspective view of a three-dimensional stack of a motor drive architecture in accordance with embodiments.
Figure 4:
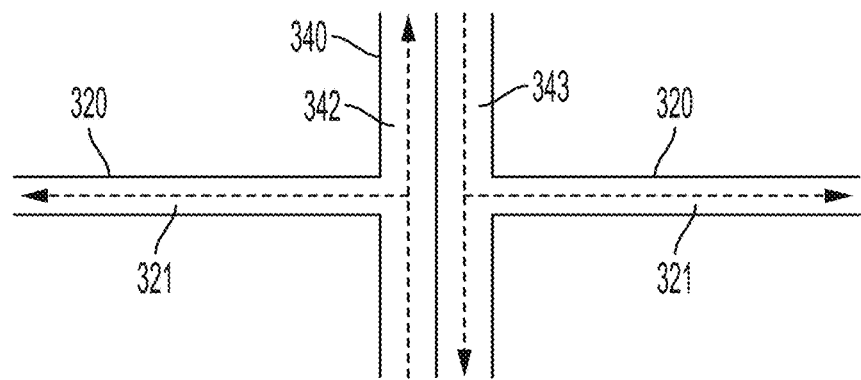
FIG. 4 is a schematic illustration of fluid pathways of a cold plate and a support of a three-dimensional stack of a motor drive architecture in accordance with embodiments.
Figure 5:
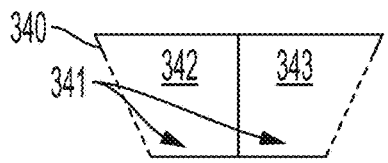
FIG. 5 is a schematic illustration of fluid pathways of a support of a three-dimensional stack of a motor drive architecture in accordance with embodiments.

With continued reference to FIG. 2 and with additional reference to FIGS. 3-5, an integrated motor drive architecture 300 is provided and includes an electric machine, such as the aircraft electric machine 200 or other types of electric machines, such as power converters for DC/DC, DC/AC and AC/AC power conversion, and the power module system 206 described above with reference to FIG. 2.

As shown in FIGS. 3-5, the power module system 206 of FIG. 2 is provided as a motor drive architecture and includes a three-dimensional (3D) stack 310 of cold plates 320 and supports 340. The 3D stack 310 can be integrated with and adjacent to the aircraft electric machine 200 (see FIG. 2) with plenum 311 (see FIG. 2) axially interposed between the 3D stack 310 and the aircraft electric machine 200. Power electronics 330 for controlling applications of current to the windings 211 (see FIG. 2) are mountable on the cold plates 320. Each cold plate 320 has an annular shape, which is fittable about the shaft 220 (see FIG. 2). As shown in FIG. 4, each cold plate 320 is formed to define an internal fluid pathway 321. The supports 340 are disposed and configured to support each of the cold plates 320 in the 3D stack 310. As shown in FIG. 5, a least one support 340 is formed to define an internal cavity 341 that is bifurcated into an internal inlet fluid pathway 342 and an internal outlet fluid pathway 343. The internal inlet fluid pathway 342 is receptive of fluid from an external source and is configured to direct the fluid into the internal fluid pathway 321 of each cold plate 320. The internal outlet fluid pathway 343 is receptive of the fluid from the internal fluid pathway 321 of each cold plate 320 and is configured to direct the fluid toward the external source.

In accordance with embodiments, the fluid can be a coolant of various types and compositions and the external source can be provided as a component of a closed-look cooling system.

In accordance with embodiments, each of the cold plates 320 of the 3D stack 310 can be arranged coaxially with the other cold plates 320 with equidistant or non-equidistant spacing between neighboring cold plates 320. The power electronics 330 can include power devices and gate drivers 331 arranged coaxially on each of the cold plates 320 and capacitors 332 on at least one of the cold plates 320. That is, the power devices and gate drivers 331 can be arranged in respective linear groups on the cold plates 320 and the capacitors 332 can be arranged in a circumferential array on the cold plate 320 which is closest to the plenum 311 (see FIG. 2). The supports 340 can be arranged along an axial dimension of the 3D stack 310, which is parallel with a longitudinal axis of the shaft 220 (see FIG. 2), and can be uniformly separated from one another. For example, in a case in which three supports 340 are provided, each support 340 is arranged 120 degrees from its neighbors.

In accordance with further embodiments, each of the supports 340 can be formed to define the internal cavity 341. In these or other cases, the internal cavity 341 of each support 340 is bifurcated into the internal inlet fluid pathway 342 and the internal outlet fluid pathway 343 as described above.

Figure 6:
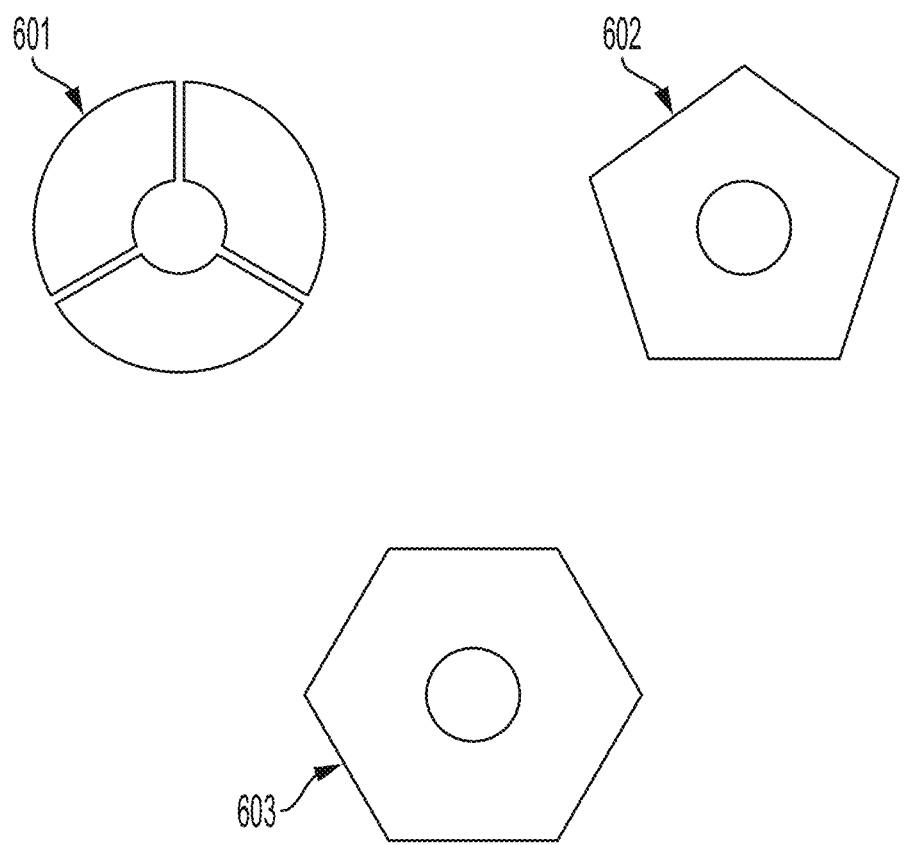
FIG. 6 is a schematic illustration of various cold plate shapes in accordance with embodiments.

With reference to FIG. 6, it is to be understood that, although the cold plates 320 are described above as being annularly shaped and fittable about shaft 220, various embodiments exist as to the exterior shape of the cold plates 320. For example, as shown in FIG. 6, the cold plates 320 can be circular 601, pentagonal 602 or hexagonal 603 or any other similar type of shape and, for each shape, the cold plates 320 can be segmented (see the circular 601 example).

In addition and with continued reference to FIG. 6, each cold plate 320 can have a configuration that is defined in accordance with a configuration of the electric machine. For example, for cases in which the electric machine is a 3-phase machine with three cold plates 320, each of the cold plates 320 can be provided to electrically serve a phase leg with power devices mounted on each side and passive components on the back side to minimize parasitic losses.

Technical effects and benefits of the present disclosure are the provision of a 3D stack-up of a motor drive in which integration of the motor and drive provides for minimization of parasitic losses an achievement of higher efficiencies. The 3D stack-up also provides for a compact design and increased power density.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A motor drive architecture, comprising:
a three-dimensional (3D) stack of cold plates on which power electronic components for an electric machine are mountable,
each cold plate comprising a cold plate body having an annular shape with internal fluid pathways extending through an interior of the cold plate body; and
supporting structures to hold the cold plates in the 3D stack,
at least one supporting structure defining an internal cavity bifurcated into an internal inlet fluid pathway configured to direct fluid into the internal fluid pathways of each cold plate and an internal outlet fluid pathway receptive of the fluid from the internal fluid pathways of each cold plate.

2. The motor drive architecture according to claim 1, wherein the power electronic components are configured to execute switching operations and comprise passive and active components on at least one of the cold plates.

3. The motor drive architecture according to claim 1, wherein:
each of the cold plates of the 3D stack is fittable about a shaft of the electric machine and is coaxial with the other cold plates, and
the power electronic components comprise power devices and gate drivers arranged coaxially on each of the cold plates.

4. The motor drive architecture according to claim 1, wherein each cold plate has a configuration in accordance with a configuration of the electric machine.

5. The motor drive architecture according to claim 1, wherein the cold plates are stacked in the 3D stack with equidistant spacing or non-equidistant spacing.

6. The motor drive architecture according to claim 1, wherein:
the internal inlet fluid pathway of the at least one supporting structure is receptive of the fluid from an external source, and
the internal outlet fluid pathway of the at least one supporting structure is configured to direct the fluid toward the external source.

7. The motor drive architecture according to claim 1, wherein:
each of the support structures comprises a support structure body that defines an internal support structure cavity bifurcated into internal inlet and outlet fluid pathways extending through interiors of each of the support structure bodies,
the internal inlet fluid pathways being configured to direct the fluid into the internal fluid pathways of each cold plate, and
the internal outlet fluid pathways being receptive of fluid from the internal fluid pathways of each cold plate.

8. An integrated motor drive architecture, comprising:
an electric machine comprising a stator, a rotor, a shaft which is driven to rotate by an electromagnetic field induced by current applied to windings of the stator; and
a three-dimensional (3D) stack of cold plates on which power electronic components for controlling applications of the current to the windings are mountable,
each cold plate comprising a cold plate body having an annular shape, which is fittable about the shaft, with internal fluid pathways extending through an interior of the cold plate body; and
supporting structures to support each of the cold plates in the 3D stack,
at least one supporting structure defining an internal cavity bifurcated into an internal inlet fluid pathway configured to direct fluid into the internal fluid pathways of each cold plate and an internal outlet fluid pathway receptive of the fluid from the internal fluid pathways of each cold plate.

9. The integrated motor drive architecture according to claim 8, wherein the power electronic components are configured to execute switching operations and comprise passive and active components on at least one of the cold plates.

10. The integrated motor drive architecture according to claim 8, wherein:
each of the cold plates of the 3D stack is fittable about a shaft of the electric machine and is coaxial with the other cold plates, and
the power electronic components comprise power devices and gate drivers arranged coaxially on each of the cold plates.

11. The integrated motor drive architecture according to claim 8, wherein each cold plate has a configuration in accordance with a configuration of the electric machine.

12. The integrated motor drive architecture according to claim 8, wherein the cold plates are stacked in the 3D stack with equidistant spacing or non-equidistant spacing.

13. The integrated motor drive architecture according to claim 8, wherein:
the internal inlet fluid pathway of the at least one supporting structure is receptive of the fluid from an external source, and
the internal outlet fluid pathway of the at least one supporting structure is configured to direct the fluid toward the external source.

14. The integrated motor drive architecture according to claim 8, wherein:
each of the supporting structures comprises a support structure body that defines an internal support structure cavity bifurcated into internal inlet and outlet fluid pathways extending through interiors of each of the support structure bodies,
the internal inlet fluid pathways being configured to direct the fluid into the internal fluid pathways of each cold plate, and
the internal outlet fluid pathways being receptive of fluid from the internal fluid pathways of each cold plate.

15. An integrated motor drive architecture, comprising:
an electric machine comprising a stator, a rotor, a shaft which is driven to rotate by an electromagnetic field induced by current applied to windings of the stator; and
a three-dimensional (3D) stack of cold plates integrated with the electric machine and on which power electronic components for controlling applications of the current to the windings are mountable, each cold plate comprising a cold plate body having an annular shape, which is fittable about the shaft, with internal fluid pathways extending through an interior of the cold plate body; and supporting structures to support each of the cold plates in the 3D stack, at least one supporting structure defining an internal cavity bifurcated into an internal inlet fluid pathway configured to direct fluid into the internal fluid pathways of each cold plate and an internal outlet fluid pathway receptive of the fluid from the internal fluid pathways of each cold plate.

16. The integrated motor drive architecture according to claim 15, wherein the power electronic components are configured to execute switching operations and comprise passive and active components on at least one of the cold plates.

17. The integrated motor drive architecture according to claim 15, wherein:

each of the cold plates of the 3D stack is fittable about a shaft of the electric machine and is coaxial with the other cold plates, and the power electronic components comprise power devices and gate drivers arranged coaxially on each of the cold plates.

18. The integrated motor drive architecture according to claim 15, wherein each cold plate has a configuration in accordance with a configuration of the electric machine.

19. The integrated motor drive architecture according to claim 15, wherein the cold plates are stacked in the 3D stack with equidistant spacing or non-equidistant spacing.

20. The integrated motor drive architecture according to claim 15, wherein:

the internal inlet fluid pathway of the at least one supporting structure is receptive of the fluid from an external source, and the internal outlet fluid pathway of the at least one supporting structure is configured to direct the fluid toward the external source.

* * * * *